US008399072B2

(12) United States Patent
Revankar et al.

(10) Patent No.: US 8,399,072 B2
(45) Date of Patent: Mar. 19, 2013

(54) PROCESS FOR IMPROVED CHEMCIAL VAPOR DEPOSITION OF POLYSILICON

(75) Inventors: Vithal Revankar, Houston, TX (US); Sanjeev Lahoti, Houston, TX (US)

(73) Assignee: Savi Research, Inc., Houston, TX (US)

( * ) Notice: Subject to any disclaimer, the term of this patent is extended or adjusted under 35 U.S.C. 154(b) by 398 days.

(21) Appl. No.: 12/478,089

(22) Filed: Jun. 4, 2009

(65) Prior Publication Data

US 2010/0272922 A1 Oct. 28, 2010

Related U.S. Application Data

(60) Provisional application No. 61/172,468, filed on Apr. 24, 2009.

(51) Int. Cl.
*C23C 8/00* (2006.01)
*C23C 16/00* (2006.01)

(52) U.S. Cl. .................................... 427/588; 427/248.1

(58) Field of Classification Search .................. 427/588, 427/248.1
See application file for complete search history.

(56) References Cited

U.S. PATENT DOCUMENTS 4,150,168 A 4/1979 Yatsurugi et al.
6,749,824 B2 * 6/2004 Keck et al. .................... 423/348
7,927,571 B2 * 4/2011 Altmann et al. ............. 423/348

* cited by examiner

*Primary Examiner* — Kelly M Gambetta
(74) *Attorney, Agent, or Firm* — Baker & McKenzie, LLP

(57) ABSTRACT

A process for producing silicon rods including providing a reactor vessel containing at least one reaction chamber surrounded by a jacket, wherein a pre-heating fluid is circulated in the jacket; one or more electrode assemblies extending into the reaction chamber wherein each electrode assembly comprises a gas inlet, one or more heat transfer fluid inlets/outlets, at least one pair of silicon filaments, the filaments connected to each other at their upper ends with a silicon bridge to form a filament/slim rod assembly, each filament/slim rod assembly enclosed in an isolation jacket; a source of a silicon-bearing gas connected to the interior of the vessel for supplying the gas into the reaction chamber to produce a reaction and to deposit polycrystalline silicon on the filament by chemical vapor deposition thereby producing a rod of polycrystalline silicon; a heat transfer system that is connected to the jacketed reaction chamber that supplies heat transfer fluid to preheat the reaction chamber; and a power supply wherein the power supply supplies less than about 26,000 volts; wherein the apparatus does not include a heating finger is provided.

30 Claims, 3 Drawing Sheets

PROCESS FOR IMPROVED CHEMCIAL VAPOR DEPOSITION OF POLYSILICON

CROSS REFERENCE TO RELATED APPLICATIONS

This application claims priority to U.S. Application Ser. No. 61/172,468, filed on Apr. 24, 2009, which is incorporated herein in its entirety.

FEDERALLY SPONSORED RESEARCH

Not applicable.

REFERENCE TO MICROFICHE APPENDIX

Not applicable.

FIELD OF THE INVENTION

The present invention relates to a novel process for chemical vapor deposition (CVD) of polysilicon. In particular, the present invention relates to the process of producing polysilicon chunk materials via the decomposition of gaseous silane precursors.

BACKGROUND OF THE INVENTION

The production of polysilicon chunk materials via the decomposition of a gaseous precursor compound on a slim rod substrate is a well-known, widely used process commonly referred to as the "Siemens process." The Siemens process is a combined decomposition/deposition process that comprises: (1) one or more slim rods (appropriate substrates) covered by a suitable enclosure to allow high temperature, air-tight operation; (2) a system to feed the precursor material or compound of desired composition without contamination; (3) heating the enclosed slim rods to a desired temperature under appropriate environment; (4) decomposing the precursor material preferentially on the heated surface of the slim rods; (5) recovery or disposal of byproduct or unreactant gases; and (6) recovery of product without contaminating the product.

Typical Siemens processes and reactors, the reactant gas is fed to the slim rods from a single port resulting in uneven growth. Such uneven gas distribution over the length of the rod further promotes heavy homogeneous nucleation. Such uneven growth and homogeneous nucleation promote eventual reactor failure. Moreover, the slim rods within typical Siemens process reactors are not individually isolated. As a result, homogeneous nucleation, lower conversion, higher by-products, and uneven growth on the rods is further promoted by uneven radiant heat between the rods and gas precursor distribution.

Known systems utilizing the Siemens process use at least two power supplies hooked to each reactor connection system. One or more primary power supply is used for heating and maintaining the temperature of the slim rod (or deposition rods) system for gas decomposition/deposition. A secondary power supply is necessary at initiation to overcome the resistance of the silicon rod and must supply very high voltage, greater than about 26,000 volts for a typical reactor (with the voltage based on the length and diameter of the slim rod assembly used). The necessity for a high voltage power supply significantly increases the cost and safety concerns of operating such known reactors.

In some known reactors, rather than use a very high voltage source, a heating finger is introduced into the reaction space and parallel to the deposition rods. To preheat the reaction space, the heating finger is lowered into the reaction space in the proximity of the deposition rods. Once the slim rods are at the optimum eclectically conductive condition and temperature and electrical current can be passed through the rods, the heating finger is removed from the reactor, and the opening in the metallic enclosure is sealed. These reactors present further issues with the purity and integrity of the product, throughput, and establishing and maintaining a seal as well as safety, operational and maintenance issues.

According to known processes, elemental silicon is obtained in the Siemens type reactor, in the form of cylindrical rods of high purity by decomposing silicon halides from the gas phase at a hot surface of the pure and purified silicon filament, the preferred halides being the chlorides, silicon tetrachloride and trichlorosilane. These compounds become increasingly unstable at temperatures above 800° C. and decompose. Heterogeneous nucleation, hence silicon deposition, starts at about 800° C. and extends to the melting point of silicon at 1420° C. Since the deposition is beneficial only on the substrate, the inner walls of the decomposition chamber must not reach temperatures near 800° C. in order to prevent wasteful deposition on the chamber walls. In known Siemens process reactors, the reactor walls are generally cooled to prevent such wasteful deposition and also to maintain the structural integrity of the assembly. However, cooling the walls consumes additional energy to over come the additional temperature difference.

A further issue with the cooling of the reactor walls is the thermophoretic deposition of powder particles on the cooled reactor walls. Such deposition is generally weak resulting in the multiple recirculation of the particles in the gas stream. This deposited powder eventually gets loose and collapse into the reactor, causing premature failure.

The silicon halides used most frequently for the preparation of high purity silicon are silicon tetrachloride and trichlorosilane. These halides will undergo pyrolysis when in contact with the hot surface and deposit elemental silicon. To obtain reasonable and economical yields, however, an excess of hydrogen gas is added to the silicon halide vapor reaction feed gas. Because of its proportionally higher silicon content per unit weight and comparatively lower deposition temperature (i.e., faster kinetics), trichlorosilane will deposit more silicon than silicon tetrachloride and is therefore the preferred material for the Siemens' process for the preparation of polycrystalline silicon. Silicon halides with less than three chlorine atoms, such as $SiH_2Cl_2$ and $SiH_3Cl$, in particular, deposit much more silicon per mole of silicon halide consumed in the reaction but are impractical because they are not readily available and thus less desirable economically. In any case, the yield is not more than 20% and by-product gases are very difficult to handle.

Another approach to improved deposition rates is to use mixtures of silane and hydrogen where fast kinetics and lower temperatures assist faster deposition and better conversion. For example, silane ($SiH_4$) offers itself as an effective silicon precursor and having no chlorine in the molecule improves the silicon to hydrogen ratios of silicon reaction gas mixtures. Silane decomposes above 400° C. forming silicon and hydrogen. The byproducts formed are silane and hydrogen which may be readily recycled.

BRIEF SUMMARY OF THE INVENTION

Embodiments of the invention provide a process for producing a polycrystalline silicon rod including: (i) providing a silicon rod production apparatus, comprising: (a) a reactor vessel containing at least one reaction chamber surrounded by a jacket, wherein a pre-heating fluid is circulated in the jacket; (b) one or more electrode assemblies extending into the reaction chamber wherein each electrode assembly comprises a gas inlet; (c) one or more heat transfer fluid inlets/outlets, at least one pair of silicon filaments, the filaments connected to each other at their upper ends with a silicon bridge to form a filament/slim rod assembly, each filament/slim rod assembly enclosed in an isolation jacket; (d) a source of a silicon-bearing gas connected to the interior of the vessel for supplying the gas into the reaction chamber to produce a reaction and to deposit polycrystalline silicon on the filament by chemical vapor deposition thereby producing a rod of polycrystalline silicon; (e) a heat transfer system that is connected to the jacketed reaction chamber that supplies heat transfer fluid to preheat the reaction chamber; and (f) a power supply wherein the power supply supplies less than about 26,000 volts; wherein the apparatus does not include a heating finger; (2) preheating the reaction chamber to a temperature at which the silicon filaments become more conductive by circulating a heat transfer fluid in the heat transfer system; (3) heating the silicon filaments to a silicon deposition temperature by applying an electric current from the power supply; (4) feeding a reactant gas stream to the reaction chamber; (5) decomposing at least a part of the reactant gas stream to form silicon; and (6) depositing silicon on the silicon filaments to produce a polycrystalline silicon rod.

The reactor has a thick and thermally cooled base plate. The base plate has cavities to facilitate passage of a heat transfer liquid, gas inlet, diluents inlet, electrode inserts and exhaust port. A metal bell-shaped enclosure which is surrounded by an enclosed channel with a jacket to facilitate passage of a heat transfer liquid over the outside surface of the bell-shaped enclosure. Thin rods of silicon are mounted in a U-shaped configuration on an electrode and are held in place on the base plate. The electrodes are coupled to electrical connectors which pass through the base plate and are tied to an electric power source.

Additional steps in the inventive process include preheating the reaction chamber to a temperature at which the silicon filaments become conductive by circulating a heat transfer fluid in the heat transfer system surrounding the slim rods/silicon filaments; heating the silicon filaments to a silicon deposition temperature by applying an electric current from the power supply; feeding a reactant gas stream to the reaction chamber; decomposing at least a part of the reactant gas stream to form silicon; and depositing silicon on the silicon filaments to produce a polycrystalline silicon rod.

DETAILED DESCRIPTION OF THE INVENTION

The present invention is a novel method for producing polysilicon chunk materials via the decomposition of a gaseous silane and related gasses precursor compound on a slim silicon rod substrate.

Unless otherwise specified, all quantities, percentages and ratios herein are by weight.

Figure 1:
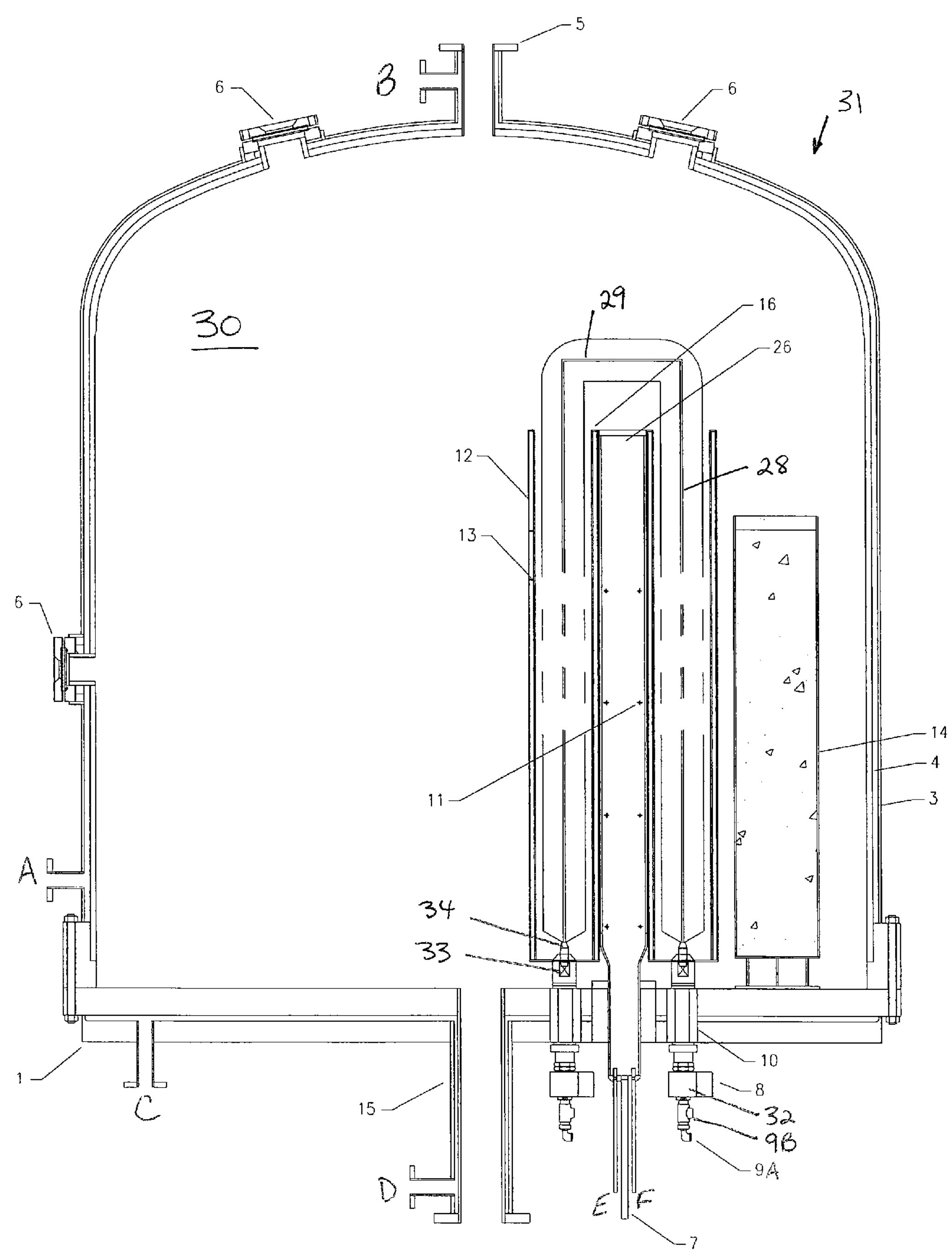
FIG. 1 is a schematic partial cutaway view of an embodiment of a chamber assembly for a chemical vapor deposition (CVD) reactor used in the inventive process.
Figure 3:
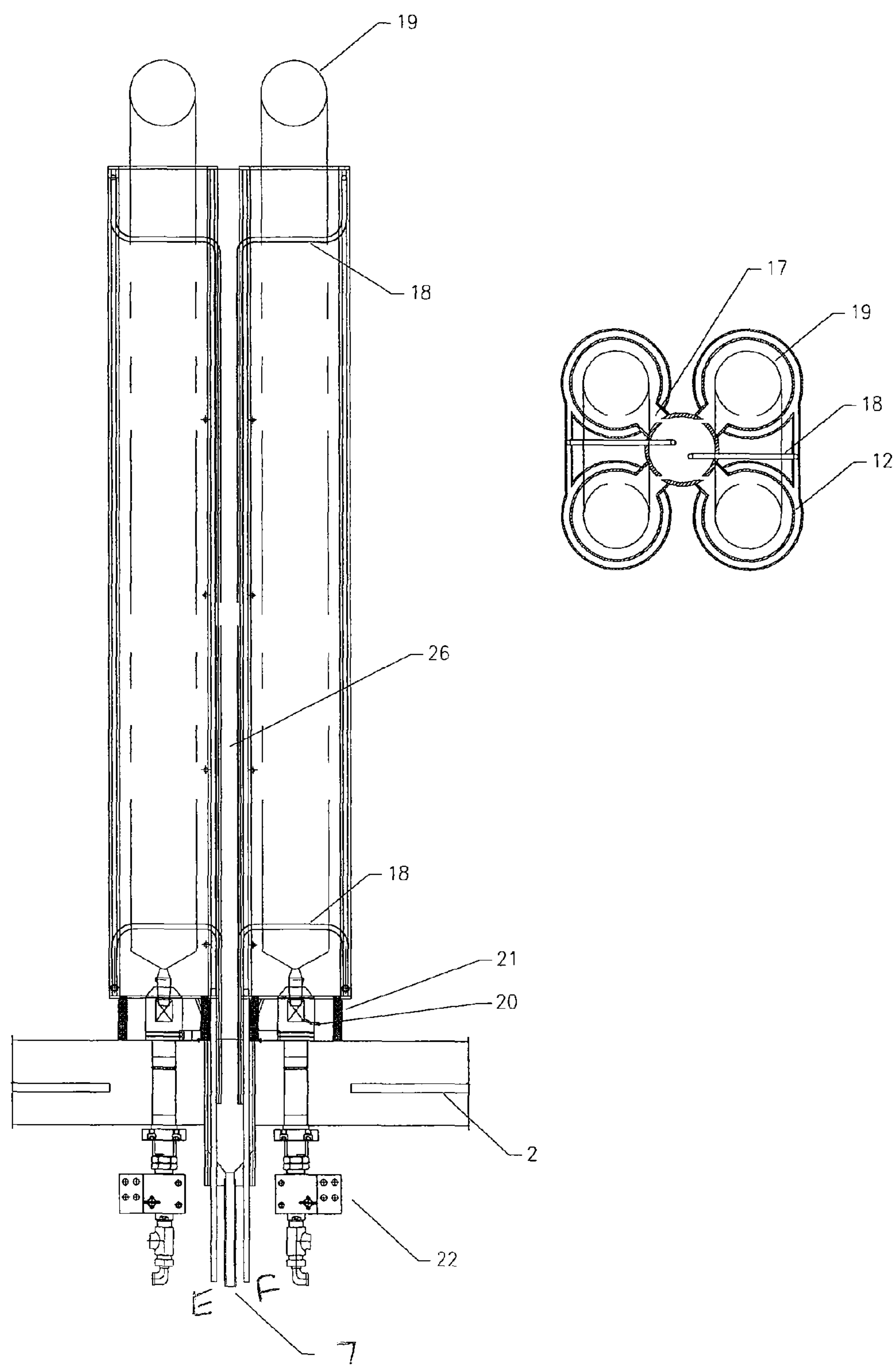
FIG. 3 is a schematic illustrating an assembly that includes an electrode arrangement, rod arrangement, chamber arrangement and gas distribution for use in the CVD reactor of FIG. 1.

The electrode assembly system in FIG. 3 supports the silicon filament/slim rods and also provides power to heat the filaments/slim rods. The electrode assembly is preferably a pair of electrodes made up of deoxygenated high purity copper and being cooled by the deionized or demineralized water. As shown in FIG. 1, the silicon filaments/slim rods are mounted on the electrode by means of a chuck 33 and a pin 34 preferably made from high purity spectrum level graphite. The two filaments are connected at the top with another filament piece commonly referred to as a bridge. The electrodes are connected at the bottom to a special power supply 32.

The temperature of the slim rods is automatically maintained as the filaments/slim rods grow to the desired diameter by adjusting the power levels based on the rod surface temperature. Pyrometers are used to sense the rod temperatures. The summary of the infrastructure is given below. In a preferred embodiment, the silicon filament is approximately 7 mm diameter×2 m long. In other embodiments, the silicon filament may have other diameters and/or lengths, as appropriate.

FIG. 1 shows an embodiment of a chemical vapor deposition (CVD) reactor chamber assembly 31 for the production of high-purity polycrystalline silicon. All surfaces which may be in direct contact with the process are preferably electropolished stainless steel. In other embodiments, high purity quartz or any other material of construction which will not contaminate polysilicon may be used for surfaces that may be in direct contact with the process. The chamber assembly 31 includes a base plate 1, an outer shell 3 having a jacket 4, a pressure relief system 5, and at least one window 6. The outer shell 3 preferably couples to the base plate 1 and forms a hollow reaction zone 30 for one or more electrode assemblies 8 to be accommodated within. In a preferred embodiment, the base plate and shell are coupled via an O-ring such that the joint remains sealed during high pressure operation. The outer shell 3 is preferably a bell shape but could be any shape that provides for the deposition reaction to occur for the one or more electrode assemblies 8. The jacket 4 is at least partially hollow and serves as a heat transfer jacket to facilitate the passage of a heat transfer liquid for either heating or cooling the interior of the chamber assembly. In a preferred embodiment, the jacket 4 is a baffled ribbed jacket. Provided in the outer shell 3 are a heat transfer inlet A/B and a heat transfer outlet A/B which allows for the circulation of a heat transfer fluid in the jacket 4 in FIG. 1. The pressure relief system 5 is designed to meet current safety and process standards. In a preferred embodiment, there are a plurality of windows 6. The windows 6 may be used as sight glasses, temperature ports or deposition thickness measurement windows.

In a preferred embodiment, the base plate 1 is a circular plate for supporting the one or more electrode assemblies 8 and each of the electrodes is separated via a ceramic insulator. The shape of the base plate assembly 1 is chosen for the convenience of operation and may be any shape which would facilitate the manufacturing of silicon rods. The base plate 1 includes a jacket/channel 2. The jacket/channel 2 is at least partially hollow and serves as a heat transfer conduit to facilitate the passage of a heat transfer liquid for either heating or cooling. In a preferred embodiment, the jacket/channel 2 includes a plurality of baffles. In a preferred embodiment, the base plate 1 has apertures for one or more electrode assemblies 8 to be inserted therethrough. These electrodes are connected to the power supply by means of a connector 32. The base plate 1 also may include apertures C/D for the inlet and outlet of heat transfer liquids. In a preferred embodiment, the same heat transfer fluid will also cool the discharge gases via exhaust port 15.

Figure 2:
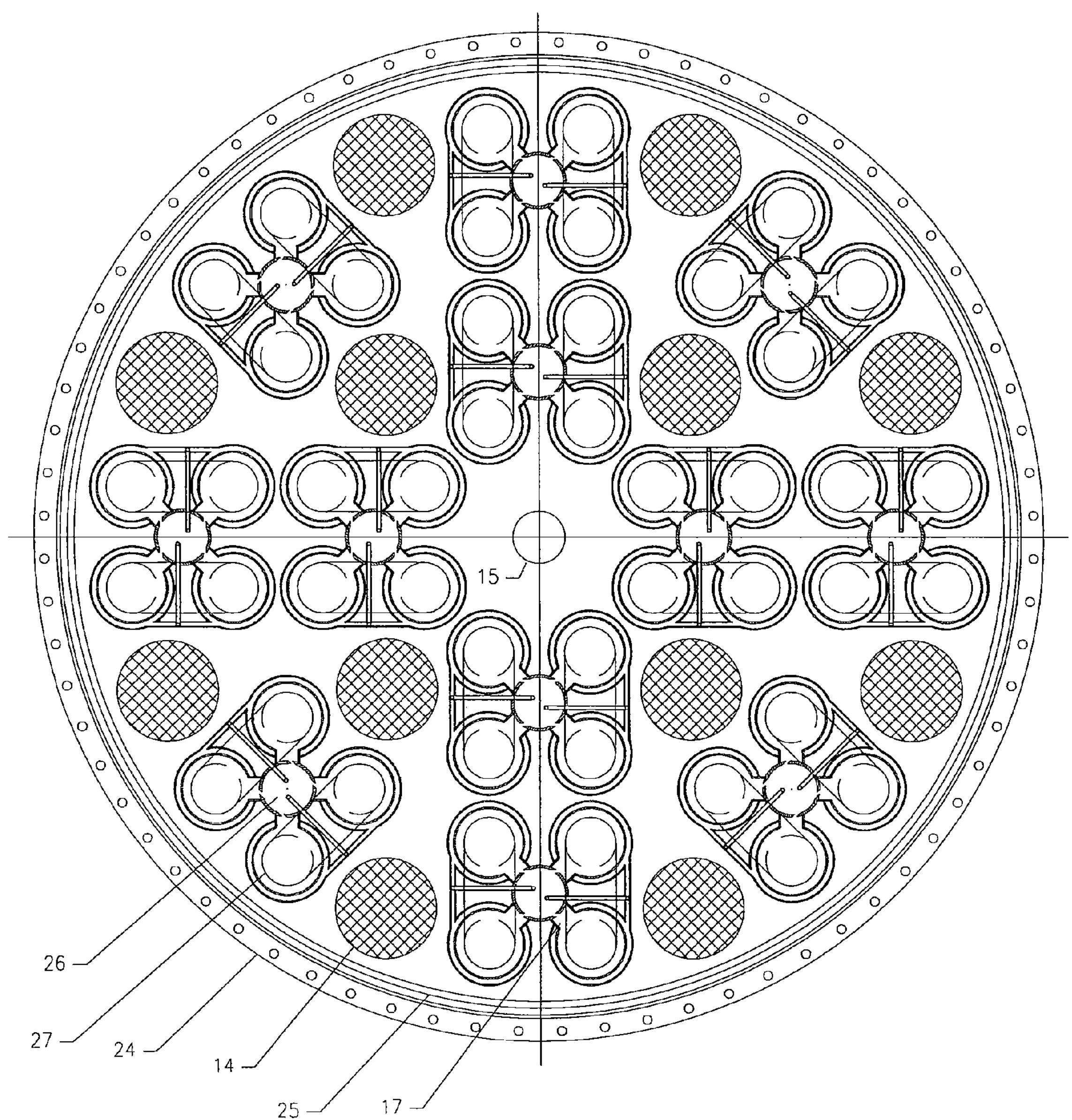
FIG. 2 is a cross-section schematic for an embodiment of a fully loaded chamber cross sectional view along line 3-3 of the CVD reactor of FIG. 1.

Referring to FIG. 2, preferably there are twelve (12) sets of electrode assemblies 8 supported on the base plate 1, giving a total of 48 electrodes. The number of electrode assemblies 8 which may be supported by the base plate assembly 2 is determined by the shape and size of the base plate 2 and the accompanying services necessary in the chemical vapor deposition process. Also supported by the base plate 1, are twelve (12) insulation dummies 14 arranged in and around the electrode assemblies 8 in a pattern to reduce the gas volume/waste deposition area. In a preferred embodiment, an exhaust port 15 is situated in the approximate center of the base plate 1 to remove any unreacted components, gases and silicon fine dust.

The power supply system is especially designed and includes sets of silicon slim rods, which can be independently controlled. Essentially, each set of rods in the CVD reactor is connected to a special power control, AC/DC converter technology for the electrical power supply. The electrical characteristics of this process requires a wide range for the DC voltage and current at the input of each set of rods. In order to complete this production cycle, which may last several hours, the power supply comprises a rectifier unit with low, middle and high power, a transformer and a controller. One or more power supplies are connected to the electrodes to pass current through the polysilicon rods 19 for heating the rods. The power supplies may be any of a wide variety known or later developed in the art. Some embodiments include a low frequency power supply, or a high frequency power supply, and a switch suitable to connect one or the other of the power supplies to the electrodes. The low frequency power supply supplies current at a relatively low frequency, such as the 60 Hz standard frequency (or the European standard power frequency of 50 Hz). The high frequency power supply is capable of operating in the 2 kilohertz to 800 kilohertz range with an AC current. Conveniently, the power supplies could be combined in a single, variable current power supply (not shown) that has integral switching circuitry and is capable of operating at both low and high frequencies. In preferred embodiments, each set of four rods are connected to a power supply including a rectifier unit of single-phase full wave and a bridge rectifier circuit. The multiple stage control (0-100%) is used to go from high voltage to low voltage and low current to high current. In a preferred embodiment, current controlled (constant current at a thickness), stable operation is used for precise power control.

Referring to FIGS. 1 and 3, the electrode assemblies 8 include a gas inlet 7, one or more heat transfer fluid inlets/outlets 9 A/B, one or more power connections 22. In a preferred embodiment, one electrode assembly 8 includes four (4) silicon filaments 28. A pair of silicon filaments 28 are connected to each other at their upper ends via a silicon bridge 29 to provide a U-shaped filament on which a polysilicon rod circuit is formed. The silicon filaments 28 are positioned in the electrode assemblies 8 and held at their lower ends by one or more carbon chuck system 20. The chuck system 20 comprises chuck 33 and pin 34 which is removable, In a preferred embodiment, the silicon filaments are about 7 mm diameter× about 2 m long. The chucks 20 are surrounded by an isolation insulator 21. In a preferred embodiment, the insulator 21 is ceramic. The temperature of the silicon filaments 28 is automatically maintained as the polysilicon rods 19 grow to the desired diameter by adjusting the power levels based on the polysilicon rod 19 surface temperature. Non contact pyrometers (not shown) may be used to sense the rod temperatures.

Each of these silicon filaments/slim rods 28 has its own jacketed, isolation chamber 12. Jacketed isolation chambers 12 preferably include interior baffles 13 to uniformly distribute heat transfer fluid passing through them with inlet/outlet E and inlet/outlet F. The jacketed isolation chamber 12 is connected to the heat transfer fluid inlets/outlets A/B for supplying a heating/cooling medium. The jacketed, isolation chamber 12 preferably isolates the polysilicon rod 19 along its length and also serves as an insulator. Power is connected to the connector 22 to supply power to the electrodes and the silicon filaments 28. The reactor chamber assembly 10 is powered by several sets of power supply, and every one (1) phase of input power is connected to three (3) sets of power supply so that the balance of phase is kept. In some embodiments, the polysilicon rods 19 are isolated and under controlled environment as far as temperature is concerned to prevent or reduce the problem of homogeneous nucleation and uneven growth. Insulating the radiant heat between the polysilicon rods 19 along the overall length of the rod is very important for long running of the reactor and prevent excessive powder formation due to homogeneous gas phase nucleation.

The jacket assembly also includes a reactant gas delivery pipe 7 extending upwardly from below through the base plate 2 and connects to a gas distribution system 26 including a plurality of gas distribution nozzles 11 that are spaced to distribute gas along the silicon filament. Provided inside each of the gas distribution nozzles 11 is a capillary or an orifice to enable the gas to be ejected uniformly through the gas distribution nozzles 11. In some embodiments, the assembly includes a free space (not shown) immediately following the gas distribution nozzles 11 so that the gasses can achieve the decomposition temperature very quickly.

The heat transfer liquid, is a material with heat stability and performance characteristics that are compatible with temperatures of greater than 300° C. The fluids utilized as a heat transfer fluid here is of low in toxicity and pose a relatively low flammability hazard. In a preferred embodiment, an example of such a heat transfer fluid is Syltherm® 800, a polyorganosiloxane fluid by Dow Corning. Syltherm® 800 Heat Transfer Liquid is a trimethylsilyl-endblocked polydimethylsiloxane fluid with heat stability additives. The temperatures of the chamber assembly is preferably kept below approximately 300° C. Typically the temperature is maintained between about 220 and about 310° C. The same flow loop for circulating the heat transfer liquid for heating is also used to cool the components of the system by maintaining an appropriate temperature difference. Such preheating also minimizes the effect of negative coefficient of resistivity of the silicon rods and thereby lowers the effect of electronic current flow preferentially through the center of the rods. Thus, the inventive process requires less current in comparison to the standard Siemens process.

The process for producing silicon rods includes lowering the bell-shaped enclosure upon the base plate and being sealed for leak-proof, pressure operation. A stream of preheated hydrogen and other reactant silane is fed through the gas inlet 7 and distributed along the length of the silicon filaments 28 via the gas distribution nozzles 11 along the jacket 12. The gaseous precursor compound contacts the heated thin silicon filaments 28 and decomposes; the silicon material is then deposited on the surface of the heated silicon filaments 28. Gaseous by-products of the decomposition reaction and excess reactants exit as a combined gas stream through the exhaust port 15. The combined gas stream is passed to a cooling means, such as a cold quencher, and a filter for handling the by-product gases and excess reactants. A hot heat transfer liquid stream is circulated through the jacket in the individual jacket of the rods and the bell-shaped enclosure to facilitate preheating of the thin rods to a preferred electrical conductive temperature. The heat transfer liquid should be a material with heat stability and performance characteristics that are compatible with temperatures of approximately 350° C. Once the silicon filaments 28 are preheated and brought to decomposition temperature, the feed stream of reactants is fed. Once the system begins depositing, the electrically-heated silicon filaments 28 transfer heat to the surroundings by radiation and convective heat transfer, and cooling is required to protect the structural integrity of the metallic components of the system and surrounding isolation jacket. The temperatures of the base plate and the bell-shaped enclosure should be kept much below approximately 70° C. and the isolation jacket temperature be kept below 310° C. to avoid the silane decomposition on its surface. The exhaust heat transfer fluid is cooled by means of a steam generator in which the heat of the hot heat transfer liquid is removed by converting liquid water to steam and heat exchanger. In a preferred embodiment, the recovered heat as steam will be utilized in the silane manufacturing process or other related process. Part of the exit heat transfer fluid is cooled by exchanging the heat with the incoming silane and hydrogen feed gas thereby recovering additional process energy.

Because silicon is not very electrically conductive at ambient temperature, the silicon filaments 28 may be preheated to a desired electrically conductive temperature, typically at least 220° C., to increase their conductivity. The surfaces of the preheated silicon filaments 28 then can be maintained at an elevated temperature by supplying electricity to the filaments through the electrodes so the surfaces can serve as silicon deposition surfaces. Preheating is accomplished by supplying a heat transfer fluid through inlet 9 in the jacketed, isolation chamber 12 of the electrode assembly 8. Preheating can also be accomplished by operation of a radiant heat source (not shown) inside the reactor.

The filaments also may be preheated by directly supplying low frequency AC current thereto through the electrodes, as described in U.S. Pat No. 4,150,168, but at a high voltage. For example, filaments may be heated by applying a voltage as high as 30,000 volts at a frequency of 60 Hz. However, in our arrangement, after the silicon slim rods are heated up beyond a temperature of 200° C. to 240 C, its resistance to conduction of electricity decreases with increasing temperature, so it has "broken into conduction." At that point, the voltage required is about 3,000 v for the same system described in the above mentioned patent to provide a desired silicon deposition surface temperature in the range of 600° C. to 1200° C. A silane gas, most advantageously monosilane gas, is fed into the reactor through the gas pipe 11 and the gas nozzles 13. While ascending inside the jacketed, isolation chamber 12, and preheated by gas preheating chamber 17 and the gas is further heated by the silicon starter filaments 28. The gas reacts and decomposes to deposit on the surfaces of the silicon starter filaments 28 and polysilicon grows. The deposited silicon builds up to form polycrystalline silicon rods 19. Each starter filament 28 thus provides an initial silicon deposition surface, and after silicon is deposited on the filament, the outer surface of the deposited silicon serves as an additional deposition surface. With monosilane gas, best results are obtained when the deposition surface of a growing rod is maintained at a temperature of about 850° C. during deposition of silicon on the rods. The rates of deposition can be increased with temperature. Reactant gas that has been blown upwards beyond the reaction chambers 12 is removed through the exhaust pipe 16. When the silicon rods are small, the current can be very low and voltage is very high. As the rods increase in diameter, the current necessary to keep the silicon deposition surface at a constant temperature steadily increases while the required voltage decreases.

Example 1

7 mm float zone silicon filaments (approx resistivity ~200 Ω/cm), 2 meter long are inserted into the jacketed cylindrical columns containing the hot circulating fluid. The silicon filament ends are mounted on a double slide-in carbon chuck that is in touch with the protruded electrode from the base plate. The bridge is connected with the slotted slim rods of 300 mm. Each of the circular columns has four gas distributing nozzles which inject the gases tangentially along the wall in a circular upward motion. The gases are injected in the space between the main heat controlled jacketed column and the distributor column where they will rapidly regain the temperature there by avoiding the cold impingement on the rod and uneven deposition/premature harvesting. The individual silicon filaments were insulated from each other and maintained at constant hot temperature of 280° C. which is substantially lower than the decomposition temperature of the silane gas. The velocity of the gas in the rod chamber was maintained above particle terminal velocity of 5 ft/sec to avoid any homogeneously formed powder accumulation in the reactor system column. The gases and all homogeneously formed powder were exhausted from the bottom and collected at high temperature in a bag house. This avoids the typical hazard of powder accumulation at the top of the reactor chamber and subsequent falling of the powder via gravity during the operation which could cause a short circuit. The generated gases were purified and re-circulated.

Once the system is loaded, the silicon filaments were preheated to approximately 280° C. with the circulating oil (flowing) at a constant temperature. When the silicon rods are growing, the temperature in the jacket is maintained constant by circulating this hot fluid. The reactor has the baseplate and cavities to facilitate passage of a heat transfer liquid to maintain the constant temperature. The exterior surface of the bell-shaped enclosure is surrounded by an enclosed channel/jacket to facilitate passage of a heat transfer liquid over the outside surface of the bell-shaped enclosure and also electrode enclosure (specialized jackets). The fluids utilized is Syltherm oil which has very low in toxicity, relatively low flammability hazard with low vapor pressure and high flash point and viscosity >9 cp.

To preheat the reactant-containing zone and the silicon filaments, hot heat transfer fluid is passed through the jacket for approximately 5 to 8 min until the power is switched on. The pressure in the reactant-containing zone is maintained at 45 psig via preheated hydrogen entering at 260° C. Hydrogen and silane gas is preheated by the same circulating hot oil. After the power start-up, the members were kept at a constant temperature of 850° C. The voltage is applied until a power level to the silicon filaments of 20 to 30 watts/cm power is reached. The voltage is maintained approximately 4-8 volts of electricity per cm of length of the filaments. As in the case of the conventional process and monosilane was supplied into the pyrolysis container through all distributors by diluting with hydrogen. A silane concentration as high as 10 molar % is used and reduced proportionately to the growth of the silicon rods. In this example, the flow was maintained for 24 hours with an average growth of 10.5 microns per minute. The conversion is measured using gas chromatography—the recorded values were over 98%. The gases are recovered and circulated back continuously via a liquid nitrogen exchange system. The hot oil circulation system is used for steam recovery to recover and maintain operating temperature. Heat losses are kept to a minimum and power consumption was less than 70 KWh/kg silicon produced. The average dust, i.e., homogenously formed silicon powder, collected was around 4%. The growth variation of the thickness of the silicon rods formed was less than 0.01% and thermophoretic deposition on the wall of the jacket was negligible.

Example 2

60 mm silicon rods formed in Example 1 were left in the reactor and maintained the same operating condition as described in Example 1, including the operating pressure of 45 psig. However, hydrogen to silane was balanced to appropriate level based on the silicon rod diameter. The oil circulation flow was also balanced to maintained the constant wall temperature. The conversion was over 99% with heat recovery of IM btu/hr per reactor. The power consumption was less than 75 KW/kg silicon produced. The dust recovery was around 3%.

Example 3

The reactor was operated as described in Example 1 except that the reactant gas had a lower hydrogen to silane ratio of about 15% less than that of Example 1 and a higher temperature (900° C.) with 5% higher silane throughput was utilized. Conversion was greater than 98%. Deposition rate was also increased to 12-15 micron per minute average. The power consumption was less than 65 KWh/kg silicon produced with dust recovery of around 5%. The variation in thickness of the formed silicon rods was less than 0.02% and thermophoretic deposition on the wall of the jacket was about a few microns thick and constituted less than 0.02% of the total silicon formed.

Although various embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth herein.

We claim:

1. A process for producing a polycrystalline silicon rod comprising the steps of:
- providing a silicon rod production apparatus, comprising:
  - a reactor vessel containing at least one reaction chamber surrounded by a jacket, wherein a pre-heating fluid is circulated in the jacket;
  - one or more electrode assemblies extending into the reaction chamber wherein each electrode assembly comprises a gas inlet, one or more heat transfer fluid inlets/outlets, at least one pair of silicon filaments, the filaments connected to each other at their upper ends with a silicon bridge to form a filament/slim rod assembly, each filament/slim rod assembly enclosed in an individual isolation jacket, wherein each individual isolation jacket provides gas distribution nozzles distributed around each filament/slim-rod assembly for feeding a reactant gas stream to the reaction chamber;
  - a source of a silicon-bearing gas connected to the interior of the vessel for supplying the gas into the reaction chamber to produce a reaction and to deposit polycrystalline silicon on the filament by chemical vapor deposition thereby producing a rod of polycrystalline silicon;
  - a heat transfer system that is connected to the jacketed reaction chamber that supplies heat transfer fluid to preheat the reaction chamber; and
  - a direct current power supply wherein the power supply supplies less than about 26,000 volts;
  - wherein the apparatus does not include a heating finger;
- preheating the reaction chamber to a temperature at which the silicon filaments become more conductive by circulating a heat transfer fluid in the heat transfer system;
- heating the silicon filaments to a silicon deposition temperature by applying an electric current from the power supply;
- feeding the reactant gas stream to the reaction chamber;
- decomposing at least a part of the reactant gas stream to form silicon; and
- depositing silicon on the silicon filaments to produce a polycrystalline silicon rod.

2. The process of claim 1, wherein the heat transfer fluid is either a liquid or a gas.

3. The process of claim 2, wherein the heat transfer fluid is a liquid.

4. The process of claim 1, wherein the heat transfer fluid is steam.

5. The process of claim 1, wherein unreacted reactant gas is recycled to the reaction chamber.

6. The method of claim 1 further comprising maintaining an outer surface of the jacket at about 250° C.

7. The process of claim 1 wherein the heat transfer fluid is capable of heating the reaction chamber to a temperature of at least about 310° C.

8. The process of claim 1 wherein the reactant gas stream is a source of a silane gas selected from the group consisting of monosilane, disilane, and mixtures thereof.

9. The process of claim 8 wherein the reactant gas stream comprises monosilane and hydrogen.

10. The process of claim 8 wherein the reactant gas stream comprises a halosilane gas.

11. The process of claim 1 wherein the power supply provides an AC current at a frequency between about 50 and about 60 Hz.

12. The process of claim 1 wherein the power supply provides an AC current at a frequency between about 2 and about 800 kHz.

13. The process of claim 1 further comprising removing gaseous by-products of the step of decomposing at least a part of the reactant gas stream and unreacted portions of the reactant gas stream as a combined gas stream from the reaction chamber.

14. The process of claim 13 further comprising condensing the combined gas stream.

15. The process of claim 1 wherein there is no thermophoretic deposition of silicon particles on a surface of the reaction chamber.

16. The process of claim 1 wherein any thermophoretic deposition of silicon particles on a surface of the reaction chamber is equal to or less than about 0.02% of the total amount of silicon particles deposited on a combination of the surface and the silicon filaments.

17. The process of claim 9 or 10 wherein less than about 6% of the monosilane or halosilane decomposes homogenously which is not deposited onto the silicon filaments.

18. The process of claim 1 wherein the reactant gas stream is injected along a length of the silicon filament via the gas distribution nozzles.

19. The process of claim 18 wherein the reactant gas stream is uniformly injected along the length of the silicon filament via the gas distribution nozzles.

20. The process of claim 1 wherein the silicon is deposited substantially uniformly along a length of the silicon filaments to produce a polycrystalline silicon rods of substantially uniform thickness.

21. The process of claim 20 wherein the substantially uniform thickness has a variation of about ±0.02%.

22. The process of claim 1 wherein silicon is deposited on the silicon filaments at a rate greater than about 5 micrometer/min.

23. The process of claim 1 wherein silicon is deposited on the silicon filaments at a rate between about 5 and about 20 micrometer/min and wherein the silicon is deposited substantially uniformly along a length of the silicon filaments to produce a polycrystalline silicon rods of substantially uniform thickness having a variation in thickness of about ±0.02%.

24. The process of claim 1 wherein the reactor chamber is maintained between about 45 and 100 psi.

25. The process of claim 23 wherein the reactor chamber is maintained at about 45 psi.

26. The process of claim 1 wherein the polycrystalline silicon rod is between about 50 and 150 mm in diameter.

27. The process of claim 1 wherein the polycrystalline silicon rod is about two meters long.

28. The process of claim 1 wherein about 98% or more of the silicon produced by decomposition of the at least part of the reactant gas stream is deposited on the polycrystalline silicon rod.

29. The process of claim 1 wherein the process utilizes less than about 75 KWh/kg silicon produced.

30. The process of claim 1 further comprising recovery of at least 50% of the heat generated by the CVD deposition process.

* * * * *